(12) United States Patent
Kim

(10) Patent No.: US 8,018,141 B2
(45) Date of Patent: Sep. 13, 2011

(54) ORGANIC LIGHT EMITTING DISPLAY DEVICE WITH TRAP FOR FOREIGN SUBSTANCE AND METHOD OF FABRICATING THE SAME

(75) Inventor: Eun-Ah Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 811 days.

(21) Appl. No.: 11/600,501

(22) Filed: Nov. 15, 2006

(65) Prior Publication Data

US 2007/0108889 A1    May 17, 2007

(30) Foreign Application Priority Data

Nov. 16, 2005    (KR) .................. 10-2005-0109865

(51) Int. Cl.
H01J 1/62 (2006.01)
H01J 63/04 (2006.01)
(52) U.S. Cl. .................. 313/504; 313/503; 313/506
(58) Field of Classification Search .......... 313/498–512
See application file for complete search history.

(56) References Cited

U.S. PATENT DOCUMENTS

| | | | | |
|---|---|---|---|---|
| 6,583,584 B2 * | 6/2003 | Duineveld et al. | ......... | 315/169.3 |
| 6,891,327 B2 * | 5/2005 | Duineveld et al. | ......... | 313/505 |
| 7,011,561 B2 * | 3/2006 | Duineveld et al. | ......... | 445/23 |
| 7,173,373 B2 * | 2/2007 | Yamada et al. | ......... | 313/505 |
| 7,531,834 B2 * | 5/2009 | Lee et al. | ......... | 257/40 |
| 2002/0158835 A1 * | 10/2002 | Kobayashi et al. | ......... | 345/100 |
| 2002/0163300 A1 * | 11/2002 | Duineveld et al. | ......... | 313/505 |
| 2003/0011304 A1 * | 1/2003 | Duineveld et al. | ......... | 313/506 |
| 2005/0023969 A1 * | 2/2005 | Omata et al. | ......... | 313/504 |
| 2005/0077816 A1 * | 4/2005 | Yamada et al. | ......... | 313/503 |
| 2005/0116632 A1 * | 6/2005 | Funamoto et al. | ......... | 313/506 |
| 2005/0179374 A1 * | 8/2005 | Kwak | ......... | 313/506 |
| 2006/0097263 A1 * | 5/2006 | Lee et al. | ......... | 257/72 |

FOREIGN PATENT DOCUMENTS

| | | |
|---|---|---|
| CN | 1573883 A | 2/2005 |
| CN | 1622708 A | 6/2005 |
| JP | 2004-103502 | 4/2004 |
| JP | 2005-276479 | 10/2005 |

(Continued)

OTHER PUBLICATIONS

English Abstract corresponding to International Publication No. WO 2004/046767 A2, International Publication Date: Jun. 3, 2004, Inventor: Daniels, John, for International Application No. PCT/US2003/037040.

(Continued)

Primary Examiner — Peter J Macchiarolo
Assistant Examiner — Thomas A Hollweg
(74) Attorney, Agent, or Firm — Christie, Parker & Hale, LLP

(57) ABSTRACT

An organic light emitting display device having a structure for trapping a foreign substance and a method of fabricating the same. The organic light emitting display device includes a substrate and a pixel electrode disposed on the substrate. A pixel defining layer has an opening for exposing a portion of the pixel electrode, and a trap disposed on at least one side of a periphery of the pixel electrode. An organic functional layer is disposed on the exposed portion of the pixel electrode and includes at least an emission layer. A counter electrode is disposed on the organic functional layer.

9 Claims, 9 Drawing Sheets

FOREIGN PATENT DOCUMENTS

| KR | 10-2005-0065680 A | 6/2005 |
| KR | 10-2005-0070402 A | 7/2005 |
| KR | 10-2005-0107840 A | 11/2005 |

OTHER PUBLICATIONS

Korean Patent Abstracts, Publication No. 1020050070402 A, Date of publication: Jul. 7, 2005, Inventor: Park, Jae Yong.

Korean Patent Abstracts, Publication No. 1020050107840 A, Date of publication: Nov. 16, 2005, Inventors: Lee, Jae Yoon et al.

Office action issued by the State Intellectual Property Office of P. R. China on Jun. 27, 2008 for related Application No. 200610138191.3 indicating relevance of reference cited herein.

Chinese Patent Registration Gazette dated Sep. 16, 2009, for corresponding Chinese application 200610138191.3.

Japanese Patent Office Action dated Sep. 7, 2010 in corresponding Japanese patent application No. 2006-303590.

* cited by examiner

ORGANIC LIGHT EMITTING DISPLAY DEVICE WITH TRAP FOR FOREIGN SUBSTANCE AND METHOD OF FABRICATING THE SAME

CROSS-REFERENCE TO RELATED APPLICATION

This application claims priority to and the benefit of Korean Patent Application No. 10-2005-0109865, filed on Nov. 16, 2005, in the Korean Intellectual Property Office, the entire content of which is incorporated by reference.

BACKGROUND OF THE INVENTION

1. Field of the Invention

The present invention relates to a flat panel display device, and more particularly, to an organic light emitting display device.

2. Description of the Related Art

In general, an organic light emitting display device is a light emitting display device having characteristics such as a wide viewing angle, high contrast, and/or a rapid response speed. Therefore, it is drawing attention as a next-generation display device.

A conventional organic light emitting display device includes an anode, an organic emission layer disposed on the anode, and a cathode disposed on the organic emission layer. When a voltage is applied between the anode and the cathode, holes are injected from the anode into the organic emission layer, and electrons are injected from the cathode into the organic emission layer. The holes and the electrons injected into the organic emission layer combine with each other to generate excitons, and the excitons are transitioned from an excited state to a ground state to emit light.

FIG. 1 is a plan view of a unit pixel of a conventional organic light emitting display device, and FIG. 2 is a cross-sectional view taken along line I-I' of FIG. 1.

Referring to FIGS. 1 and 2, an anode 12 is formed on a substrate 10. A pixel defining layer 15 is formed on the anode 12. An opening 15a for exposing a portion of the anode 12 is formed in the pixel defining layer 15. Then, the substrate and the exposed portion of the anode 12 are cleaned. The cleaning is performed to remove from the anode 12 a foreign substance 17 that may be present. However, the foreign substance 17 may not be substantially removed during the cleaning. As shown in FIG. 2, the foreign substance 17 may merely be pushed to (or moved towards) a boundary of the opening 15a (i.e., an interface between the pixel defining layer 15 and the anode 12) and may become lodged at (or attached to) the interface.

Then, an organic emission layer 20 and a cathode 25 are sequentially disposed on the exposed portion of the anode 12. When the organic emission layer 20 is disposed, portions of the organic emission layer 20 may be broken and/or caused to have a very small thickness in a vicinity of the foreign substance 17. Here, the anode 12 and the cathode 25 may become short-circuited at the broken portion and/or the very thin portion of the organic emission layer 20 (see, for example, area E in FIG. 2), thereby causing a dark pixel to form on the organic light emitting display device.

FIG. 3A shows a photograph of a foreign substance lodged at a boundary of an opening, and FIG. 3B shows a photograph of a cross-section of a substrate that is cut about the foreign substance. Like (or same) reference numerals shown in FIG. 3B designate like (or same) elements shown in FIG. 2.

Referring to FIGS. 3A and 3B, the foreign substance 17 is lodged at (or attached to) the boundary of the opening 15a that is for exposing a portion of the anode 12, and therefore, the emission layer 20 is opened by the foreign substance 17. As a result, the cathode 25 formed on the emission layer 20 may become short-circuited to the anode 12 at the opening of the emission layer 20 (see, for example, area E in FIG. 2). Here, a dark pixel is thereby formed due to the short-circuit at area E.

SUMMARY OF THE INVENTION

Aspects of the present invention provide an organic light emitting display device and a method of fabricating the same, wherein a likelihood that an anode and a cathode will be short-circuited and that a dark pixel will thereby be formed is reduced.

In an exemplary embodiment of the present invention, an organic light emitting display device includes a substrate and a pixel electrode disposed on the substrate. A pixel defining layer has an opening for exposing a portion of the pixel electrode, and a trap disposed on at least one side of a periphery of the pixel electrode. An organic functional layer is disposed on the exposed portion of the pixel electrode and includes at least an emission layer. A counter electrode is disposed on the organic functional layer.

In another exemplary embodiment according to the present invention, a method of fabricating an organic light emitting display device includes forming a pixel electrode on a substrate, forming a pixel defining layer on the pixel electrode, the pixel defining layer having an opening for exposing a portion of the pixel electrode and a trap disposed on at least one side of a periphery of the pixel electrode, forming an organic functional layer including at least an emission layer on the exposed portion of the pixel electrode, and forming a counter electrode on the organic functional layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
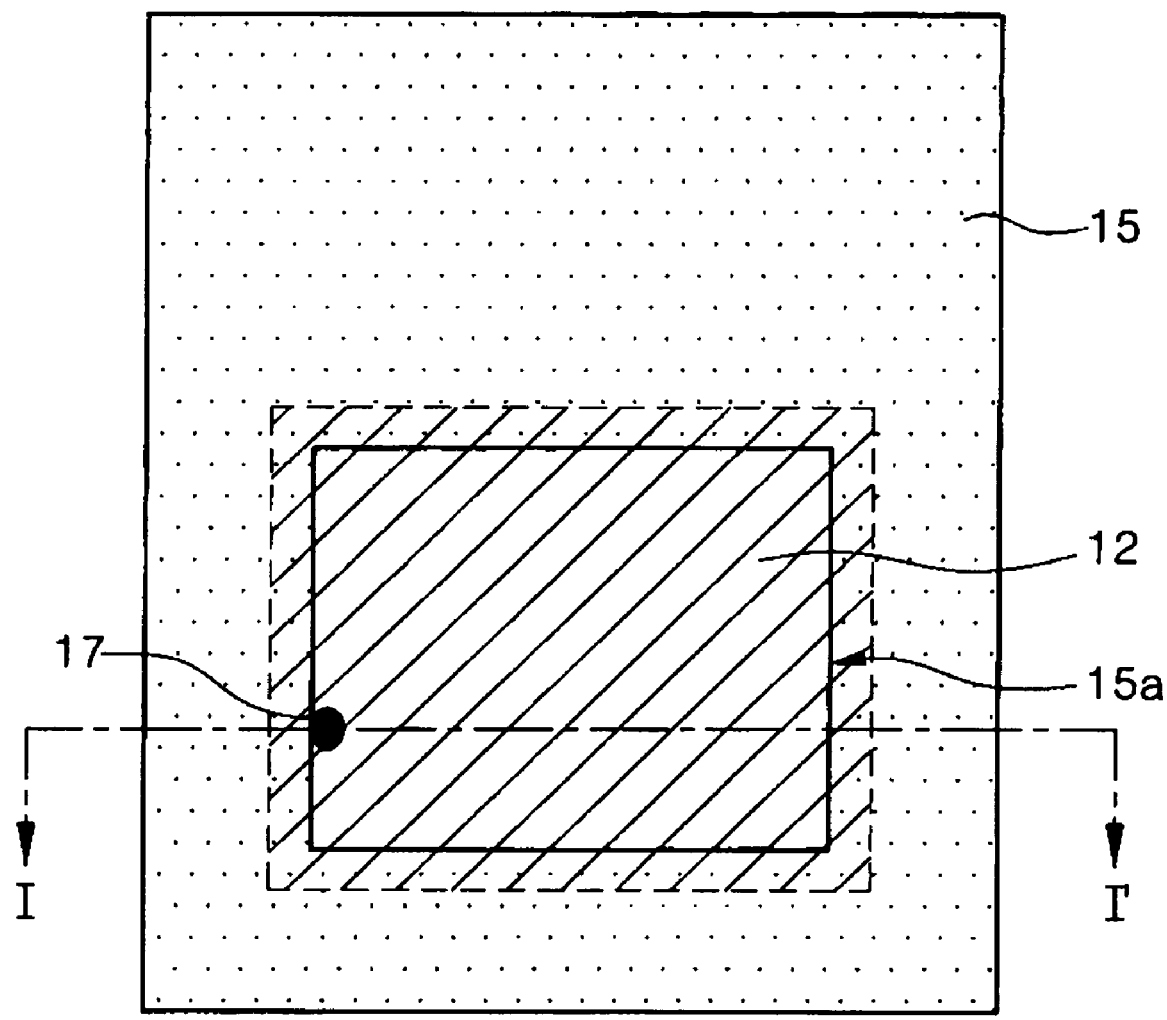
FIG. 1 is a plan view of a unit pixel of a conventional organic light emitting display device.
Figure 2:
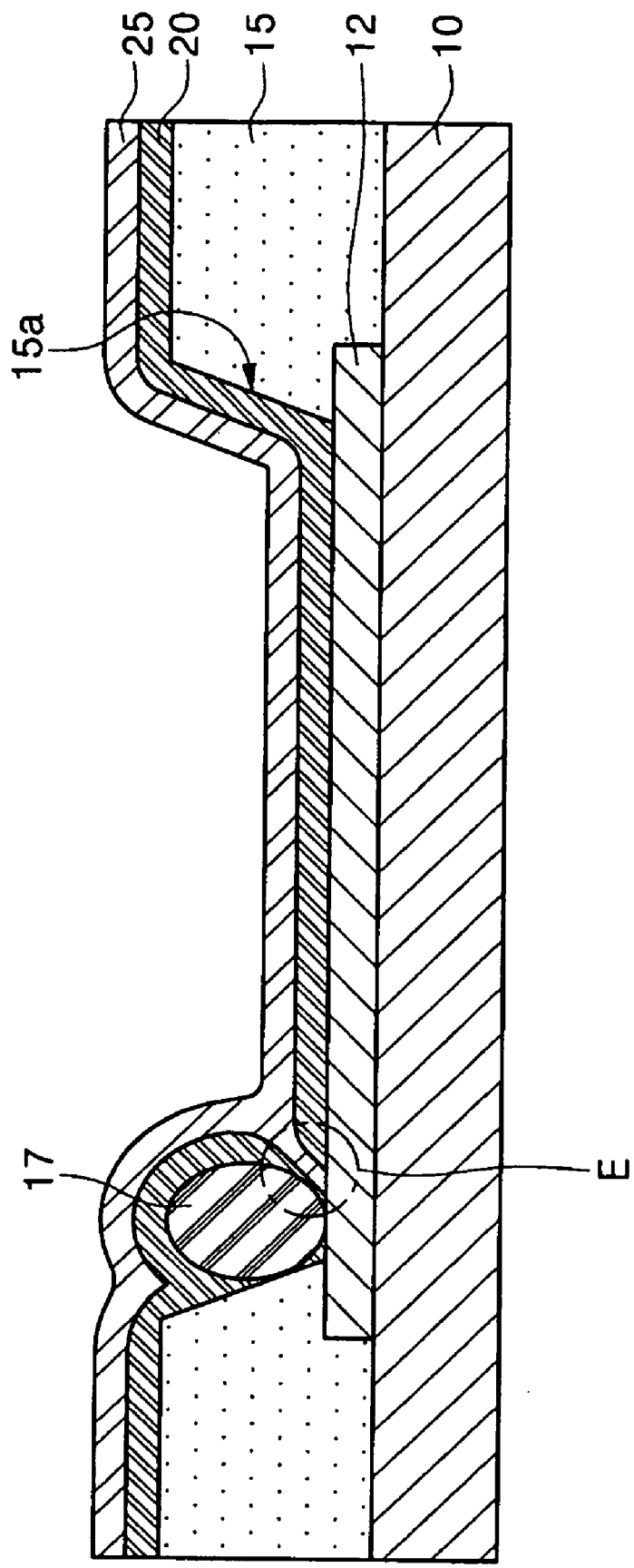
FIG. 2 is a cross-sectional view taken along line I-I' of FIG. 1.
Figure 3A:
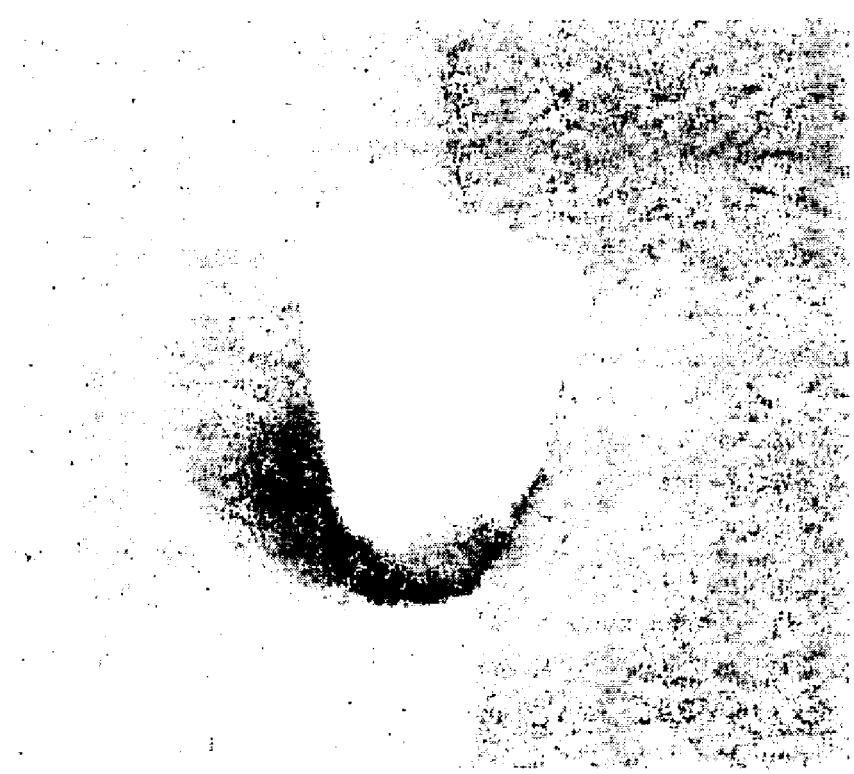
FIGS. 3A and 3B are photographs showing a short circuit between an anode and a cathode of an organic light emitting display device.
Figure 3B:
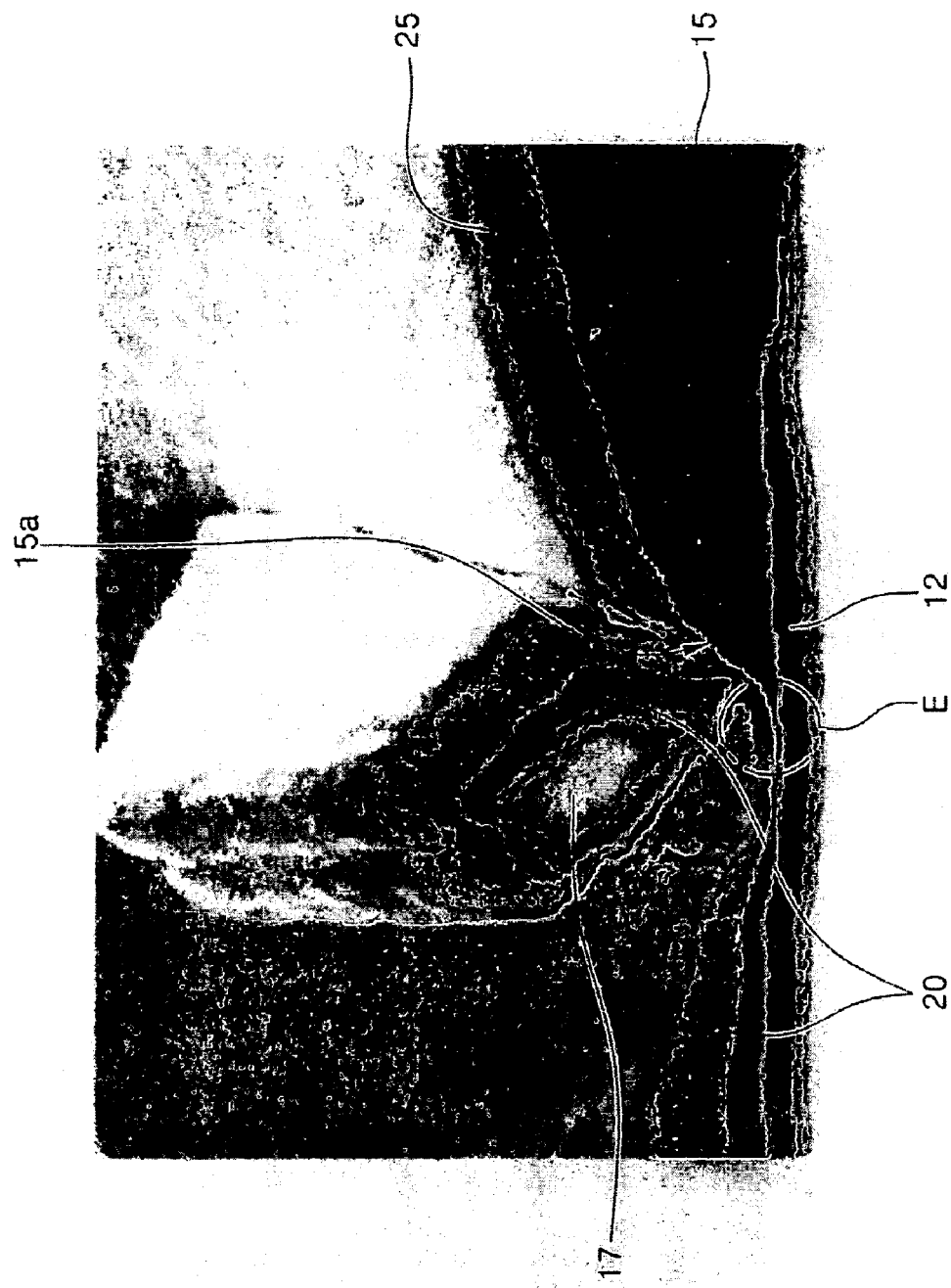
Figure 4:
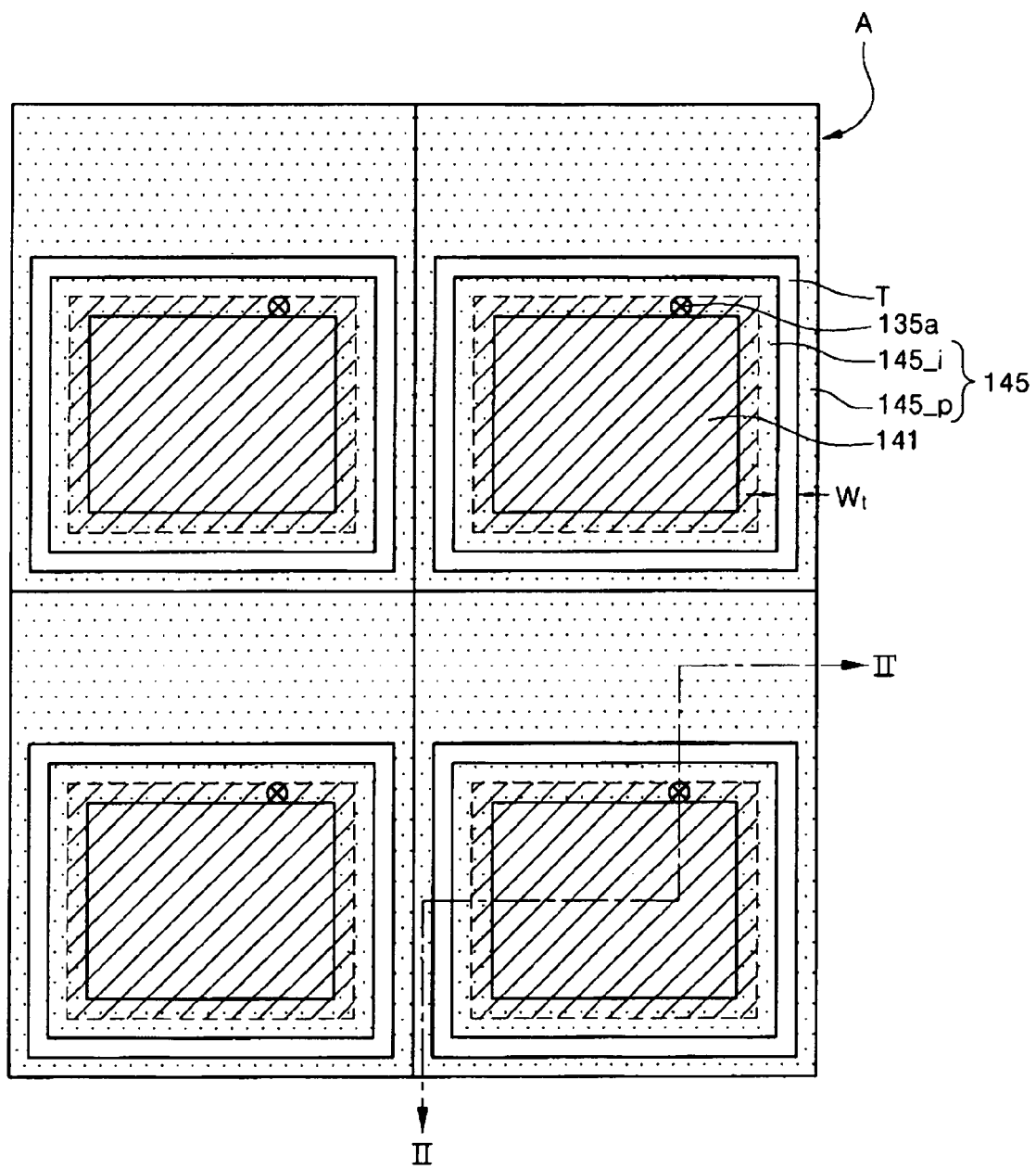
FIG. 4 is a plan view of a portion of a unit pixel array of an organic light emitting display device in accordance with an exemplary embodiment of the present invention.
Figure 5A:
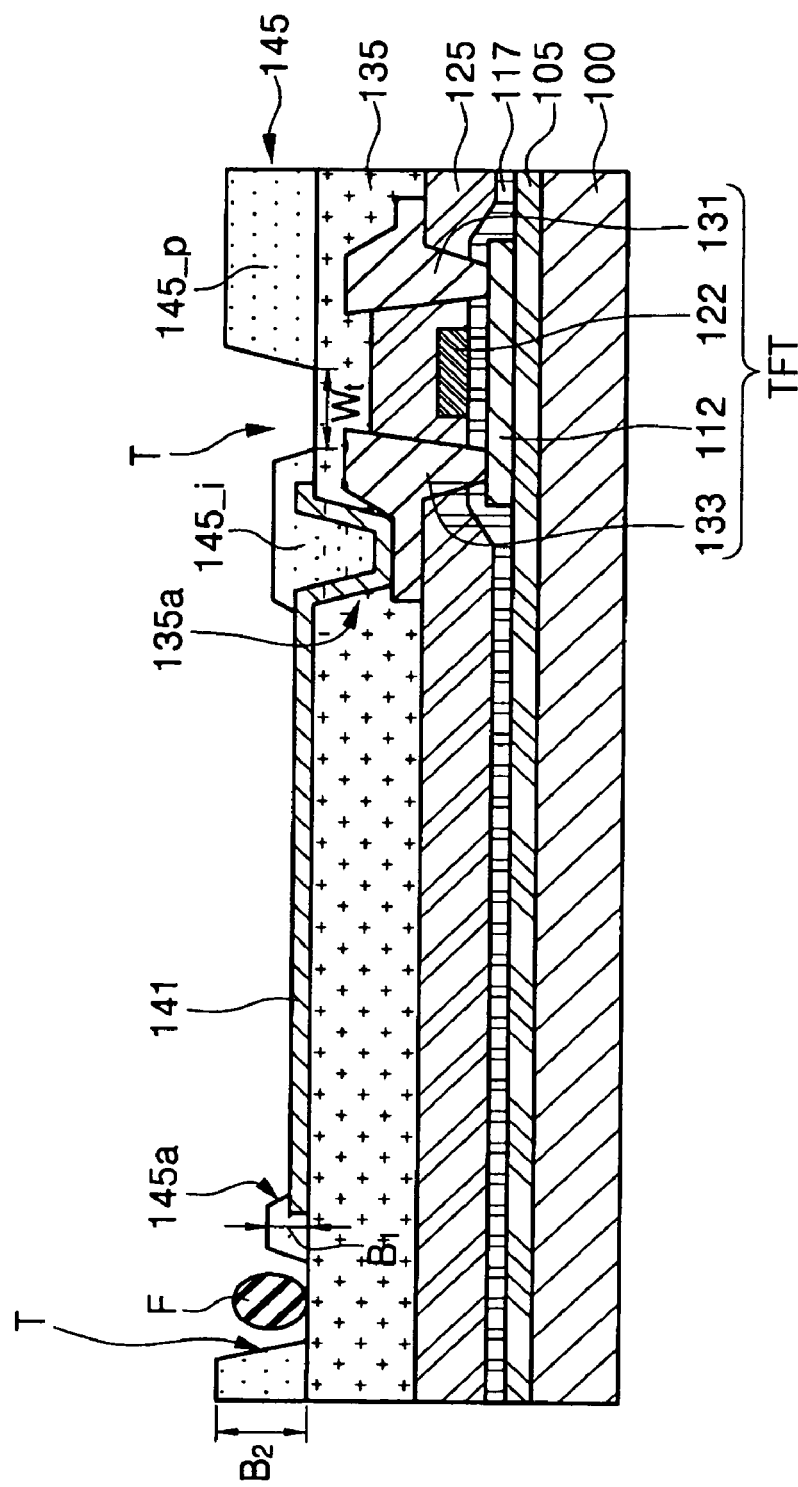
FIGS. 5A and 5B are cross-sectional views showing a method of fabricating the organic light emitting display device in accordance with an exemplary embodiment of the present invention, in which the cross-sectional views are taken along line II-II' of FIG. 4.
Figure 5B:
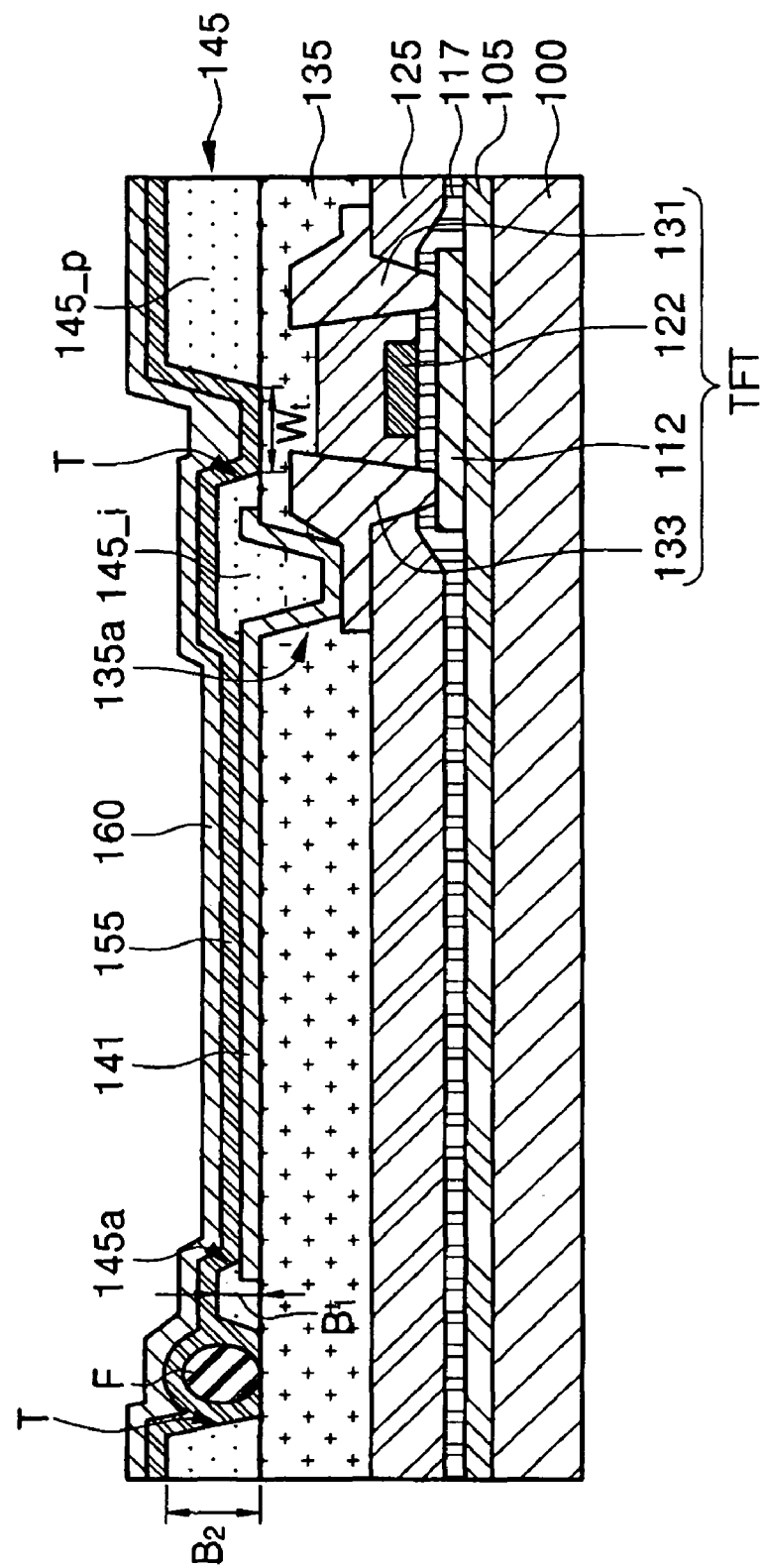

FIG. 4 is a plan view of a portion of a unit pixel array of an organic light emitting display device in accordance with an exemplary embodiment of the present invention, and FIG. 5B is a cross-sectional view showing a method of fabricating the organic light emitting display device in accordance with an exemplary embodiment of the present invention, in which the cross-sectional view is taken along line II-II' of FIG. 4.

Referring to FIGS. 4 and 5B, a substrate 100, at which a plurality of unit pixel regions A are located, is provided. A pixel electrode 141 is disposed on (or at) one of the unit pixel regions A.

A thin film transistor (TFT) electrically connected to the pixel electrode 141 is disposed on the one of the unit pixel regions A. The thin film transistor includes a semiconductor layer 112, a gate electrode 122, and source and drain electrodes 131 and 133. The source electrode 131 or the drain electrode 133 is connected to the pixel electrode 141. By way of example, the drain electrode 133 is connected to the pixel electrode 141. In more detail, an insulating layer 135 is disposed on the thin film transistor, and the insulating layer 135 has a via-hole 135a for exposing at least a portion of the drain electrode 133. The pixel electrode 141 is connected to the drain electrode 133 through the via-hole 135a.

A pixel defining layer 145 is disposed on the pixel electrode 141 and a periphery of the pixel electrode 141. The pixel defining layer 145 has an opening 145a for exposing a portion of the pixel electrode 141, and a trap T disposed on (or at) at least one side of the periphery of the pixel electrode 141. As a result, a foreign substance F, which may become lodged on the pixel electrode 141 during manufacturing of the organic light emitting display device, can become trapped in the trap T. Since the trap T is located at the periphery of the pixel electrode 141, the pixel electrode 141 itself is not exposed by the trap T. Therefore, even when the foreign substance F becomes trapped in the trap T, the pixel electrode 141 does not become short-circuited with a counter electrode, which will be described in more detail later, due to the foreign substance F.

In the described embodiment of the organic light emitting display device, a size (or diameter) of the foreign substance, sufficiently large to cause manufacturing defects, is in a range from 500 to 10,000 Å. Therefore, in one embodiment, in order to effectively trap the foreign substance F, the trap T has a width Wt from 500 to 10,000 Å. In one embodiment, the trap T has a length of 500 or more Å.

In one embodiment, the trap T may be disposed on (or at) various (or all) positions around the pixel electrode 141, i.e., upper, lower, right and left sides of the periphery of the pixel electrode 141, to maximize (or increase) a total area of the trap T, thereby increasing a likelihood of trapping the foreign substance F.

The pixel defining layer 145 also has an intermediate portion 145_i disposed, between the opening 145a and the trap T, and a peripheral portion 145_p separated from the intermediate portion 145_i. In one embodiment, the peripheral portion 145_p is any portion of the pixel defining layer 145 except the intermediate portion 145_i. The intermediate portion 145_i may cover at least an edge of the pixel electrode 141 to inhibit or prevent a short circuit between the pixel electrode 141 and the counter electrode. In addition, the intermediate portion 145_i may have a height B1 smaller than a height B2 of the peripheral portion 145_p, such that the foreign substance F can be trapped more effectively in the trap T.

As shown in FIG. 5B, an organic functional layer 155 including an emission layer is disposed on the portion of the pixel electrode 141 exposed by the opening 145a. The organic functional layer 155 may further include a charge injection layer and/or a charge transport layer located on or under the emission layer. A counter electrode 160 is disposed on the organic functional layer 155.

FIGS. 5A and 5B are cross-sectional views showing a method of fabricating the organic light emitting display device in accordance with an exemplary embodiment of the present invention.

Referring to FIG. 5A, a buffer layer 105 is formed on the substrate 100. The substrate 100 may be a transparent or a non-transparent substrate. In addition, the substrate 100 may include glass, plastic, quartz, silicon, and/or metal. The buffer layer 105 may include a silicon oxide layer, a silicon nitride layer, a silicon oxynitride layer, or a multi-layer thereof.

The semiconductor layer 112 is formed on a portion of the buffer layer 105. The semiconductor layer 112 may be an amorphous silicon layer and/or a polysilicon layer (e.g., an amorphous silicon layer that is crystallized). In one embodiment, the semiconductor layer 112 is a polysilicon layer having high mobility. A gate insulating layer 117 is formed on the semiconductor layer 112. The gate insulating layer 117 may include a silicon oxide layer, a silicon nitride layer, a silicon oxynitride layer, or a multi-layer thereof.

The gate electrode 122 overlaps at least a portion of the semiconductor layer 112 and is formed on the gate insulating layer 117. Then, conductive impurities are injected into the semiconductor layer 112 using the gate electrode 122 as a mask to form source and drain regions in the semiconductor layer 112. Here, a channel region is located between the source region and the drain region. A first interlayer insulating layer 125 is formed on the gate electrode 122 and the semiconductor layer 112. Contact holes are formed in the first interlayer insulating layer 125 to expose the source and drain regions, respectively. A conductive layer is disposed on the first interlayer insulating layer 125, in which the contact holes are formed, and then patterned to form source and drain electrodes 131 and 133 for contacting the source and drain regions of the semiconductor layer 112, respectively. The semiconductor layer 112, the gate electrode 122, and the source and drain electrodes 131 and 133 constitute a thin film transistor (TFT).

A second interlayer insulating layer 135 is formed on the source and drain electrodes 131 and 133. The second interlayer insulating layer 135 may include a passivation layer, a planarization layer, or a multi-layer thereof (e.g., a planarization layer disposed on a passivation layer). The passivation layer may include a silicon oxide layer, a silicon nitride layer, or a multi-layer thereof. In one embodiment, the passivation layer is a silicon nitride layer capable of effectively blocking gas and moisture to protect the thin film transistor thereunder, and/or containing a sufficient amount of hydrogen to passivate defective bonding(s) existing in a grain boundary of the polysilicon layer. In one embodiment, the planarization layer may include an organic layer such as a benzocyclobutene (BCB) layer, a polyimide layer, or a polyacryl layer to reduce a step of lower portion.

In one embodiment, the via-hole 135a for exposing the drain electrode 133 is formed in the second interlayer insulating layer 135. The pixel electrode 141 is formed on the second interlayer insulating layer 135 and the via-hole 135a. As a result, the pixel electrode 141 is connected to the drain electrode 133 at the via-hole 135a.

The pixel defining layer 145 is formed on the pixel electrode 141. The pixel defining layer 145 may include benzocyclobutene (BCB), acryl-based photoresist, phenol-based photoresist, and/or imide-based photoresist. Then, the opening 145a and the trap T are formed in the pixel defining layer 145. The opening 145a exposes at least a portion of the pixel electrode 141, and the trap T is disposed on (or at) at least one side of the periphery of the pixel electrode 141. The pixel defining layer 145 has the intermediate portion 145_i disposed between the opening 145a and the trap T, and the peripheral portion 145_p which is separated from the intermediate portion 145_i. In one embodiment, the peripheral portion 145_p is any portion of the pixel defining layer 145 except the intermediate portion 145_i. The height B1 of the intermediate portion 145_i may be smaller than the height B2 of the peripheral portion 145_p. To form the pixel defining layer 145, in one embodiment, the intermediate portion 145_i and the peripheral portion 145_p are concurrently or simultaneously formed using a half-tone mask.

In one embodiment, the intermediate portion 145_i is formed to cover at least an edge of the pixel electrode 141 to inhibit or prevent a short circuit between the edge of the pixel electrode 141 and the counter electrode 160.

Then, the substrate 100 and the portion of the pixel electrode 141 exposed by the opening 145a are cleaned. The cleaning is performed to remove a foreign substance F that may be present on the pixel electrode 141. However, since the substrate is cleaned by using a cleaning agent and/or a cleaning gas flowing along a certain direction, the foreign substance F disposed on the pixel electrode 141 may merely be moved (or pushed out) to the periphery of the pixel electrode 141. The foreign substance F may be trapped in the trap T disposed on at least one side of the pixel electrode 141. Here, in order to increase a likelihood of trapping the foreign substance F in the trap T, the height B1 of the intermediate portion 145_i may be small relative to the height B2. However, when the height B1 of the intermediate portion 145_i is too small, a short circuit may still be created between the pixel electrode 141 and the counter electrode 160 at the edge of the pixel electrode 141. Therefore, in one embodiment, the height B1 of the intermediate portion 145_i is larger than a thickness of the pixel electrode 141.

Since the trap T is formed around the pixel electrode 141, the pixel electrode 141 itself is not exposed by the trap T. Therefore, even when the foreign substance F is trapped in the trap T, a short circuit between the pixel electrode 141 and the counter electrode 160 will not be created due to the foreign substance F. As such, the likelihood that dark pixels are caused to be formed due to the foreign substance F is thereby reduced.

In the organic light emitting display device in an embodiment of the present invention, the foreign substance F, the presence of which may cause manufacturing defects, has a size in a range from 500 to 10,000 Å. When the foreign substance F has a size larger than 10,000 Å, the foreign substance F may be substantially removed from the substrate during the cleaning, and when the foreign substance F has a size smaller than 500 Å, even though the foreign substance F may remain on the substrate, the foreign substance F may not be sufficiently large to cause a short circuit to occur between the pixel electrode 141 and the counter electrode 160. Therefore, in one embodiment, in order to effectively trap the foreign substance F, the trap T has a width Wt in a range from 500 to 10,000 Å, and/or a length Lt of 500 or more Å.

Referring to FIG. 5B, the organic functional layer 155 including the emission layer is formed on the portion of the pixel electrode 141 exposed by the opening 145a. The organic functional layer 155 may further include a charge transport layer and/or a charge injection layer located on and/or under the emission layer. Then, the counter electrode 160 is formed on the organic functional layer 155.

Figure 6:
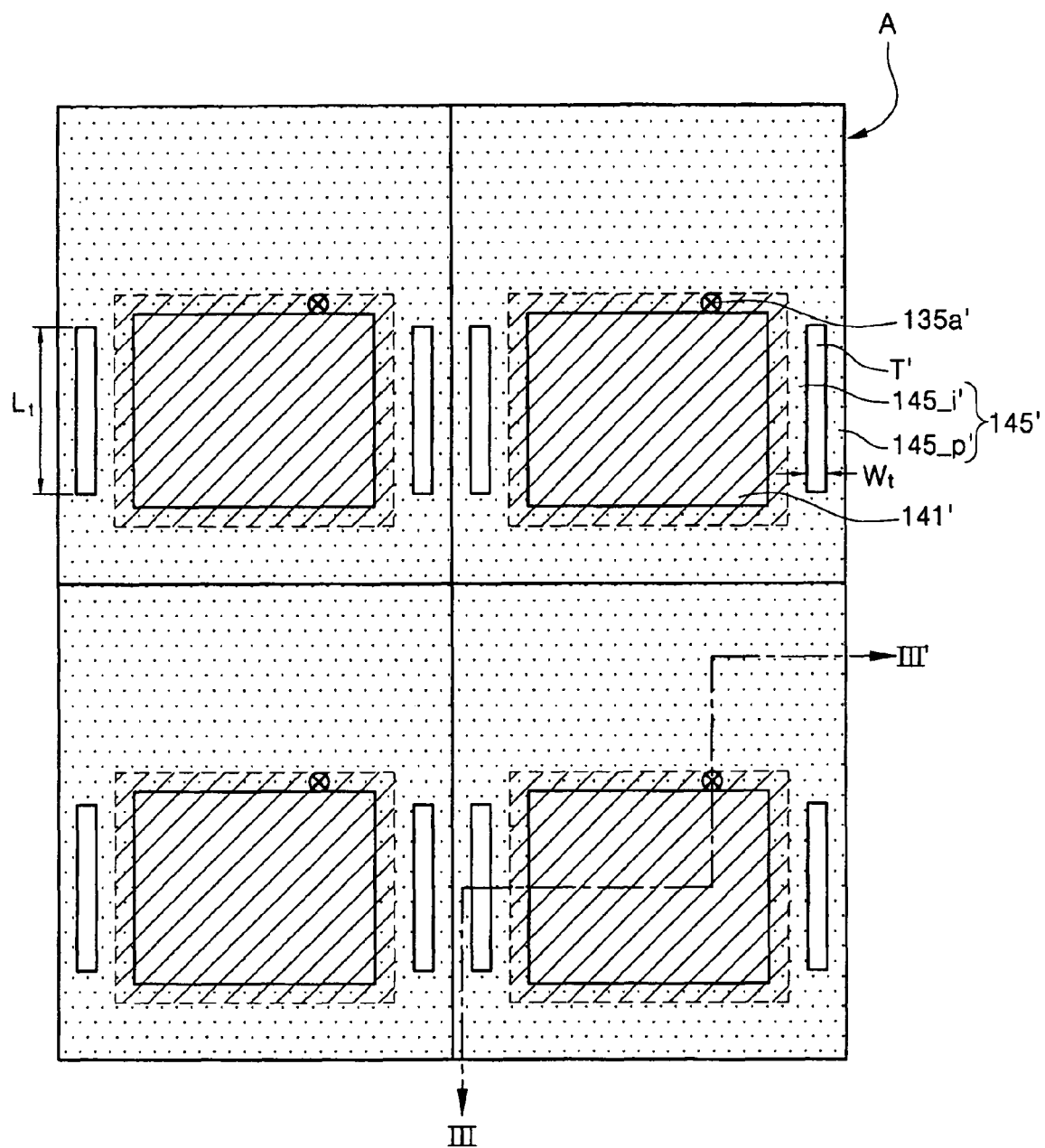
FIG. 6 is a plan view of a portion of a unit pixel array of an organic light emitting display device in accordance with another exemplary embodiment of the present invention.
Figure 7:
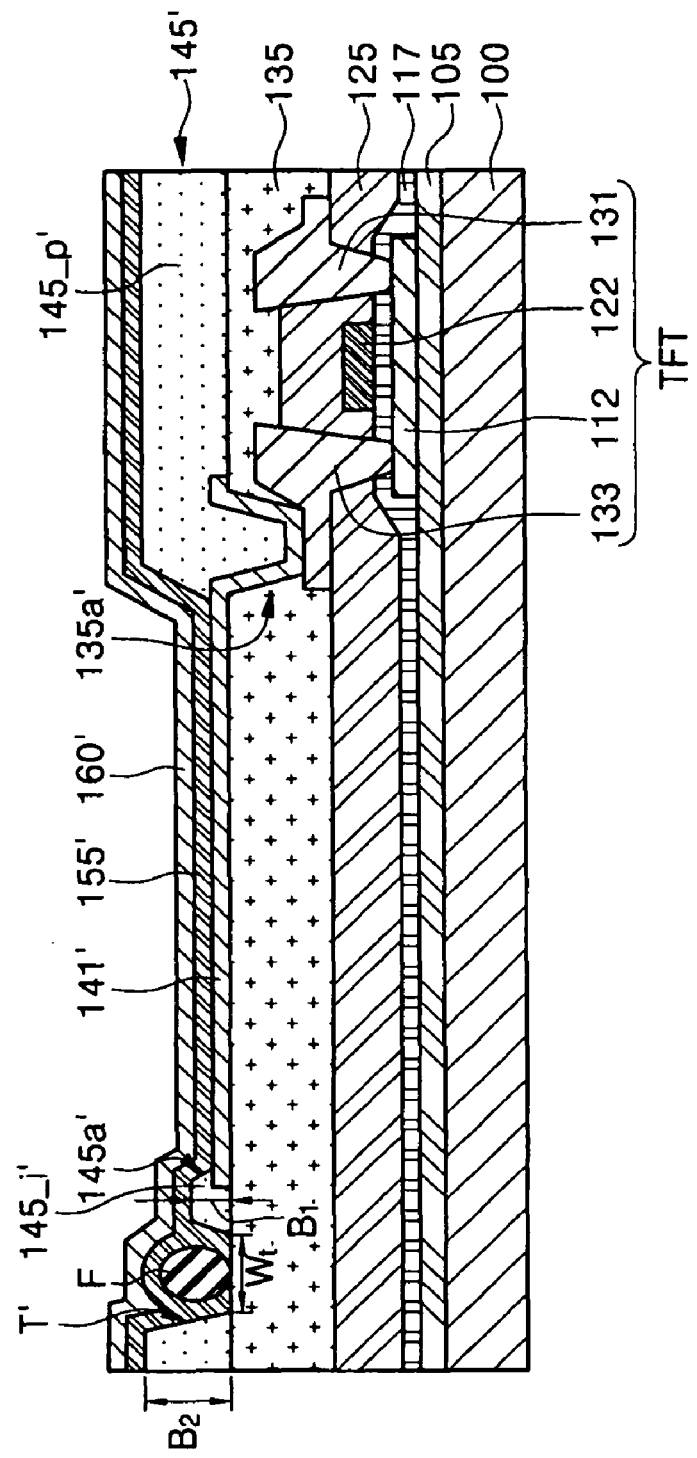
FIG. 7 is a cross-sectional view taken along line III-III' of FIG. 6.

FIG. 6 is a plan view of a portion of a unit pixel array of an organic light emitting display device in accordance with another exemplary embodiment of the present invention, and FIG. 7 is a cross-sectional view taken along line III-III' of FIG. 6. Referring to FIGS. 6 and 7, the organic light emitting display device includes a pixel electrode 141' disposed on the substrate 100. A pixel defining layer 145' is disposed on the pixel electrode 141' and a periphery of the pixel electrode 141'. The pixel defining layer 145' has an opening 145a' for exposing a portion of the pixel electrode 141', and a trap T' disposed on (or at) at least one side of the periphery of the pixel electrode 141'. The insulating layer 135 has a via-hole 135a' for exposing at least a portion of the drain electrode 133. The pixel electrode 141' is connected to the drain electrode 133 through the via-hole 135a'. The pixel defining layer 145' also has an intermediate portion 145_i' disposed between the opening 145a' and the trap T', and a peripheral portion 145_p' separated from the intermediate portion 145_i'. In one embodiment, the peripheral portion 145_p' is any portion of the pixel defining layer 145' except the intermediate portion 145_i'. An organic functional layer 155' including an emission layer is disposed on the portion of the pixel electrode 141' exposed by the opening 145a'. A counter electrode 160' is disposed on the organic functional layer 155'.

The organic light emitting display device shown in FIGS. 6 and 7 is substantially similar to the organic light emitting display device described with reference to FIGS. 4, 5A and 5B, with the following exceptions.

Referring to FIGS. 6 and 7, the trap T' may be located at both left and right sides of the pixel electrode 141'. Alternatively, the trap T' may be located at both upper and lower sides of the pixel electrode 141'. Alternatively, the trap T' may located at both the left and right sides and the upper and lower sides of the pixel electrode 141'. Alternatively, the trap T' may be formed at one of the left side or the right side, and/or one of the upper side or the lower side of the pixel electrode 141'. As described with reference to FIGS. 5A and 5B, a cleaning agent and/or a cleaning gas may be supplied to flow along a vertical and/or a horizontal direction of the substrate during the cleaning of the portion of the pixel electrode 141' exposed by the pixel defining layer 145'. Because the trap T' may be disposed on both opposite sides or one or more sides of the pixel electrode 141', it is possible to effectively trap the foreign substance F in the trap T'.

As can be seen from the foregoing, it is possible to reduce dark pixels in an organic light emitting display device by forming a pixel defining layer having a trap disposed on at least one side of a pixel electrode to trap foreign substances that are not substantially removed from a substrate.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. An organic light emitting display device comprising:
a substrate;
an insulation layer on the substrate;
a pixel electrode on the insulation layer;
a pixel defining layer on the insulating layer and having an opening for exposing a portion of the pixel electrode, and comprising:
   an intermediate portion adjacent to the pixel electrode; and
   a peripheral portion spaced from the intermediate portion to form a trap on at least one side of a periphery of the pixel electrode, the trap extending from the intermediate portion to the peripheral portion and comprising a surface of the insulation layer between the peripheral portion and the intermediate portion,
an organic functional layer on at least the exposed portion of the pixel electrode and including at least an emission layer; and
a counter electrode on the organic functional layer,
wherein a top portion of the peripheral portion is below the organic functional layer, and
wherein the intermediate portion is disposed between the opening and the trap and the peripheral portion, and wherein the intermediate portion has a height smaller than a height of the peripheral portion.

2. The organic light emitting display device according to claim 1, wherein the intermediate portion covers at least an edge of the pixel electrode.

3. The organic light emitting display device according to claim 1, wherein the trap has a width in a range from about 500 to less than 10,000 Å.

4. The organic light emitting display device according to claim 1, wherein the trap is disposed on one of an upper side or a lower side of the pixel electrode and/or one of a left side or a right side of the pixel electrode.

5. The organic light emitting display device according to claim 1, wherein the pixel defining layer includes a material selected from the group consisting of benzocyclobutene (BCB), acryl-based photoresist, phenol-based photoresist, imide-based photoresist, and combinations thereof.

6. The organic light emitting display device according to claim 1, wherein the organic functional layer further includes at least one of a charge transport layer or a charge injection layer.

7. An organic light emitting display device comprising:
a substrate;
an insulation layer on the substrate;
a pixel electrode on the insulation layer;
a pixel defining layer on the insulating layer and having an opening for exposing a portion of the pixel electrode, and comprising:
   an intermediate portion adjacent to the pixel electrode; and
   a peripheral portion spaced from the intermediate portion to form a trap on at least one side of a periphery of the pixel electrode, the trap extending from the intermediate portion to the peripheral portion and comprising a surface of the insulation layer between the peripheral portion and the intermediate portion,
an organic functional layer on at least the exposed portion of the pixel electrode and including at least an emission layer; and
a counter electrode on the organic functional layer,
wherein a top portion of the peripheral portion is below the organic functional layer, and
wherein the trap is disposed on upper and lower sides and/or left and right sides of the pixel electrode.

8. The organic light emitting display device according to claim 7, wherein the trap is disposed on the upper and lower sides and the left and right sides of the pixel electrode.

9. An organic light emitting display device comprising:
a substrate;
an insulation layer on the substrate;
a pixel electrode on the insulation layer;
a pixel defining layer on the insulating layer and having an opening for exposing a portion of the pixel electrode, and comprising:
   an intermediate portion adjacent to the pixel electrode; and
   a peripheral portion spaced from the intermediate portion to form a trap on at least one side of a periphery of the pixel electrode, the trap extending from the intermediate portion to the peripheral portion and comprising a surface of the insulation layer between the peripheral portion and the intermediate portion,
an organic functional layer on at least the exposed portion of the pixel electrode and including at least an emission layer; and
a counter electrode on the organic functional layer,
wherein a top portion of the peripheral portion is below the organic functional layer, and
wherein the trap is disposed on one of an upper side or a lower side of the pixel electrode and a one of a left side or a right side of the pixel electrode.

* * * * *